(12) United States Patent
Hasegawa

(10) Patent No.: US 6,494,359 B1
(45) Date of Patent: Dec. 17, 2002

(54) THERMO-COMPRESSION BONDING APPARATUS FOR CONNECTING A LIQUID CRYSTAL PANEL TO AN EXTERNAL DRIVE CIRCUIT

(75) Inventor: Yuuichi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/620,076

(22) Filed: Jul. 20, 2000

(30) Foreign Application Priority Data

Jul. 22, 1999 (JP) ............................................. 11-207885

(51) Int. Cl.[7] ................................................. B23K 1/06
(52) U.S. Cl. ..................................... 228/102; 228/110.1
(58) Field of Search ............................ 228/102, 110.1, 228/1.1; 152/272.2, 325, 379.9; 156/73.1, 73.4

(56) References Cited

U.S. PATENT DOCUMENTS 3,006,067 A * 10/1961 Anderson et al.
4,605,833 A * 8/1986 Lindberg
5,410,291 A * 4/1995 Kuzoka
5,810,959 A * 9/1998 Tanaka et al.
6,096,575 A * 8/2000 Okada et al.
6,291,804 B1 * 8/2001 Fujii

FOREIGN PATENT DOCUMENTS

JP 7-130795 5/1995

* cited by examiner

Primary Examiner—Tom Dunn
Assistant Examiner—Jonathan Johnson
(74) Attorney, Agent, or Firm—Katten, Muchin, Zavis, Rosenman (57) ABSTRACT

A thermo-compression bonding apparatus is for thermo-compressing a TCP and a substrate layer to connect electrode terminals. The thermo-compression bonding apparatus has a heating unit 1 for auxiliary heating a laminate which is heated by a compression bonding head whose temperature is kept at a predetermined temperature.

5 Claims, 5 Drawing Sheets

THERMO-COMPRESSION BONDING APPARATUS FOR CONNECTING A LIQUID CRYSTAL PANEL TO AN EXTERNAL DRIVE CIRCUIT

BACKGROUND OF THE INVENTION

This invention relates to a thermo-compression bonding apparatus for connecting electrode terminals of a liquid crystal panel to electrode terminals of an external drive circuit (referred to below as TCP).

An anistropic conductive film (referred to below as ACF) that is a thermosetting resin is normally used for connecting electrode terminals on a TCP film and the electrode terminals extending on the substrate to the outside from the edge of the liquid crystal (LC) panel. This connection is accomplished by temporarily bonding and holding the substrate, having the electrode terminals extending from the edge of the LC panel, laminated with the film on which the TCP electrode terminals are formed with the ACF therebetween. Pressure is then applied so as to thermo-compression bond this laminate.

A thermo-compression bonding apparatus is generally used for this connection. Then, when color LC panels were introduced, the number of TCP tripled compared with black and white LC panels. As a result, a method of simultaneously thermo-compression bonding plural TCP on one side of the LC panel has been used to shorten the connection time.

However, various new problems arise when all TCP on one side are simultaneously connected to the substrate. One of these problems is the problem of offset when bonding the LC panel electrode terminals and the TCP electrode terminals. In order to solve this problem, a semiconductor device connecting apparatus is disclosed as a conventional semiconductor device connecting apparatus in Japanese Patent Publication Tokkai Hei 7-130795 (130795/1995).

In the conventional semiconductor device connecting apparatus as will be described later, it should be noted that while the center of a long pressure head is pushed by a pneumatic cylinder to apply pressure to TCP arranged on the stage, the center of the pressure head is pushed by the pneumatic cylinder by way of a freely turning pin, and it uniformly contacts the surface of the variable temperature stage with the above noted semiconductor device connection apparatus, the force of the pressure is concentrated in the middle of the rod-shaped pressure head, causing the middle of the long pressure head to bend and deflect. As a result, the TCP positioned in the middle of the pressure head is pressurized by a vertical pressure force, but a partial force diagonal to the stage surface occurs in the pressure on the TCP positioned at both sides of the pressure head, and there is the danger of an offset between the TCP electrode terminals and the electrode terminals of the substrate.

Furthermore, when TCP size or count changes, the heat capacity of the overlapping part naturally also changes, and the thermo-compression bonding time changes. For example, when TCP size increases, the heat capacity of the overlapping part also increases, and the time required to reach the resin setting temperature increases. If the temperature of the variable temperature stage is set high in this case to speed the temperature rise time, the polarization plate of the LC panel adjacent to the variable temperature stage will be burnt by heat radiation from the variable temperature stage.

It is also difficult to maintain a uniform temperature in the placement surface of a long variable temperature stage having no indication of whether a temperature sensor is present or where it is located. Furthermore, even if temperature control of the variable temperature stage is possible, it is not possible to determine whether the TCP, ACF, and substrate layer arranged on the placement surface of the variable temperature stage have reached a desired temperature, presenting the problem that there could be TCP not bonded with the substrate layer.

SUMMARY OF THE INVENTION

An object of this invention is to provide a thermo-compression bonding apparatus and thermo-compression bonding method that can connect the electrode terminals of a substrate and the electrode terminals of TCP without the electrode terminals shifting or the polarization plate burning by holding uniformly at a desired temperature and uniformly applying pressure to a laminate of TCP, ACF, and a substrate layer.

According to an aspect of this invention, there is provided a thermo-compression bonding apparatus comprising a backup part on which a plurality of laminate members are arranged in a longitudinal direction of the backup part, and a compression bonding head with an internal heater for applying pressure to the laminate members placed on the backup part while heating the laminate members. The laminate members are formed by overlapping and temporarily fixing electrode terminals of a substrate extending from an edge of a liquid crystal panel and electrode terminals of an external drive circuit with an anistropic conductive film therebetween. The thermo-compression bonding apparatus comprises a vertically movable plate for moving the compression bonding head towards a vertical direction, a pneumatic cylinder for linking a piston rod to the vertically movable plate to applying a pressure to the compression bonding head, and auxiliary heating means disposed to the backup part at a position opposite to the liquid crystal panel for auxiliary heating the laminate members which are heated by the compression bonding head.

According to another aspect of this invention, there is provided a method of connecting liquid crystal panel electrode terminals to external drive circuit electrode terminals by thermo-compression. The method comprises the steps of (A) compressing laminate members by a compression bonding head whose temperature is kept at a predetermined temperature, to heat the laminate members to the predetermined temperature, the laminate members being formed by overlapping and temporarily fixing electrode terminals of a substrate extending from an edge of a liquid crystal panel and electrode terminals of an external drive circuit with an anistropic conductive film therebetween, (B) making the temperature of the laminate members be kept at a desired temperature by auxiliary heating means for auxiliary heating the laminate members which are heated by the compression bonding head, and (C) connecting the liquid crystal panel electrode terminals to the external drive circuit electrode terminals.

DESCRIPTION OF THE PREFERRED EMBODIMENT

Figure 1:
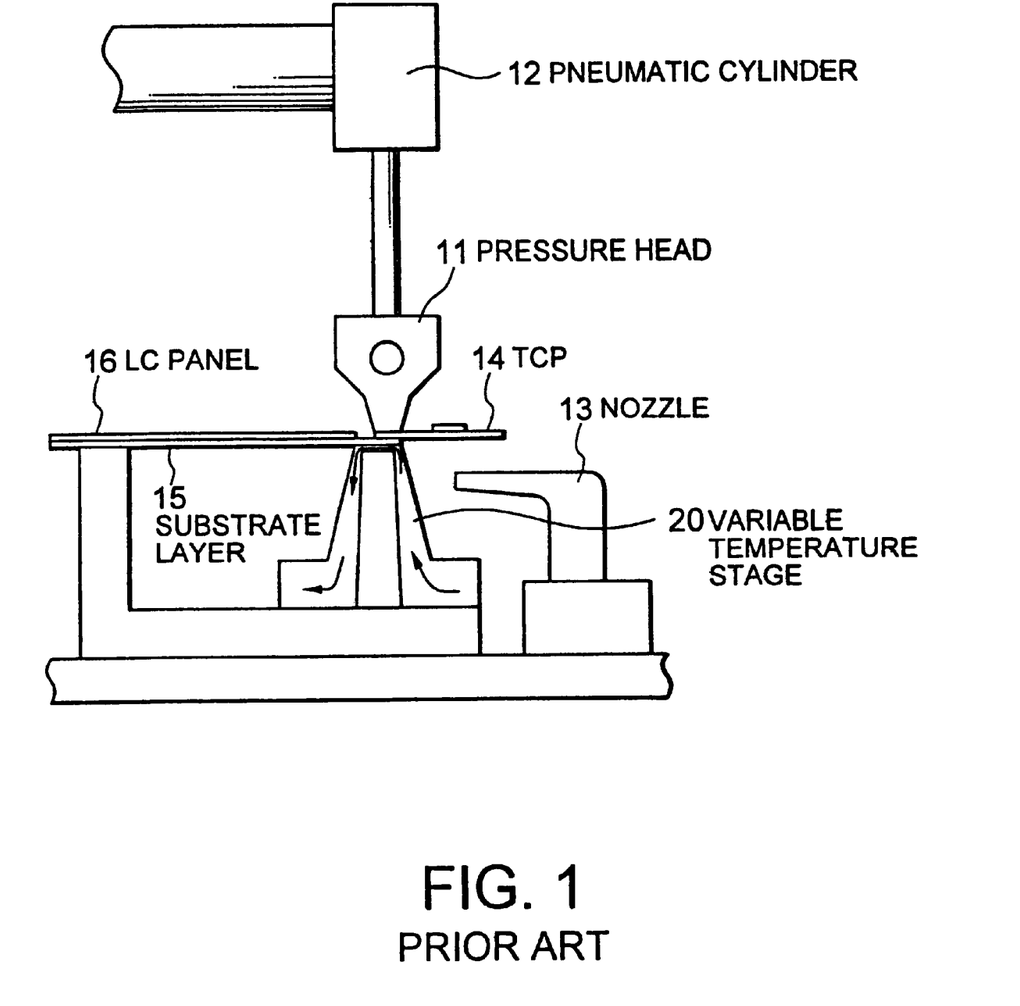
FIG. 1 shows a view of a conventional semiconductor device connecting apparatus.

Referring to FIG. 1, a convention thermo-compression bonding apparatus will be described at first in order to facilitate an understanding of this invention. The Illustrated thermo-compression bonding apparatus will be referred to as a semiconductor device connecting apparatus which is disclosed in Japanese Patent Publication Tokkai Hei 7-130795 (130795/1995). As shown in FIG. 1, the semiconductor device connecting apparatus, which is a compression bonding apparatus, has a variable temperature stage 20 on which is placed and temporarily fixed substrate layer 15, which extends from the edge of LC panel 16 and has electrode terminals, and TCP 14 with an ACF therebetween, a pressure head 11 having an internal heater and pressure applied thereto by pneumatic cylinder 12, and nozzle 13 for blowing low temperature air.

Description will be described as regards a method of bonding electrode terminals of substrate layer 15 of LC panel 16 to the TCP electrode terminals. First, a temporarily bonded laminate of substrate layer 15, ACF, and TCP 14 is placed on the variable temperature stage 20. Then, current is flowed in the direction of the arrows to variable temperature stage 20, heating substrate layer 15. The current is controlled to maintain a temperature at which the ACF begins to set, 160 degrees C., for example.

Next, by lowering pressure head 11, which is preheated and maintained at 160 degrees C., and applying pressure from above to TCP 14 to soften the ACF, establish conductivity between the conductive particles in the ACF and the electrodes, and maintain the resin setting temperature, the ACF sets, substrate layer 15 and TCP 14 are bonded, and the electrode terminals are mutually connected. Then, the pressure head 11 is lifted, the bonded part is cooled by cold air from nozzle 13, the LC panel 16 is removed from the variable temperature stage 20, and the bonding operation sequence ends.

It should be noted that this connection apparatus is characterized in that even if substrate layer 15, which has a thermal expansion coefficient greater than the TCP, stretches due to the temperature rise, there is no temperature difference between the TCP and ACF, and moreover there is no slipping between the TCP, ACF, and substrate layer 15 because the ACF and TCP 14 are laminated on and temporarily bonded to substrate layer 15 and held at the ACF softening temperature, and if pressure is then applied by pressure head 11, the electrode terminals can be bonded together with no shifting between the TCP 14 electrode terminals and the substrate layer 15 electrode terminals.

It should be noted that while the center of a long pressure head is pushed by a pneumatic cylinder to apply pressure to TCP arranged on the stage, the center of the pressure head is pushed by the pneumatic cylinder by way of a freely turning pin, and it uniformly contacts the surface of the variable temperature stage with the above noted semiconductor device connection apparatus, the force of the pressure is concentrated in the middle of the rod-shaped pressure head, causing the middle of the long pressure head to bend and deflect. As a result, the TCP positioned in the middle of the pressure head is pressurized by a vertical pressure force, but a partial force diagonal to the stage surface occurs in the pressure on the TCP positioned at both sides of the pressure head, and there is the danger of an offset between the TCP electrode terminals and the electrode terminals of the substrate.

Furthermore, when TCP size or count changes, the heat capacity of the overlapping part naturally also changes, and the thermo-compression bonding time changes. For example, when TCP size increases, the heat capacity of the overlapping part also increases, and the time required to reach the resin setting temperature increases. If the temperature of the variable temperature stage is set high in this case to speed the temperature rise time, the polarization plate of the LC panel adjacent to the variable temperature stage will be burnt by heat radiation from the variable temperature stage.

It is also difficult to maintain a uniform temperature in the placement surface of a long variable temperature stage having no indication of whether a temperature sensor is present or where it is located. Furthermore, even if temperature control of the variable temperature stage is possible, it is not possible to determine whether the TCP, ACF, and substrate layer arranged on the placement surface of the variable temperature stage have reached a desired temperature, presenting the problem that there could be TCP not bonded with the substrate layer.

Figure 2A:
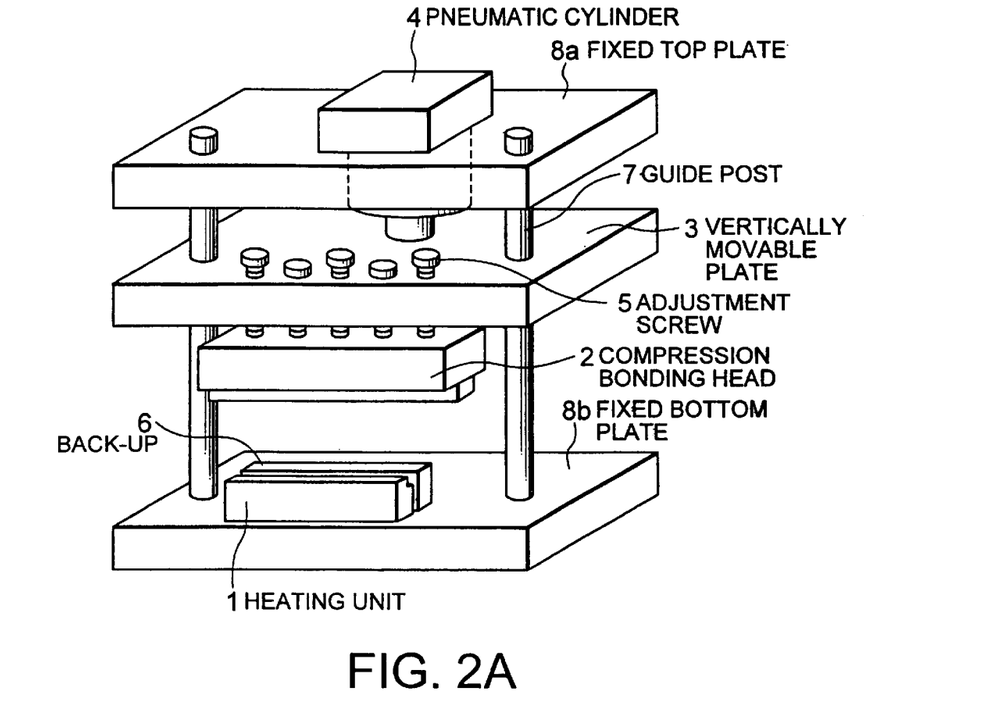
FIG. 2A shows a perspective view of a thermo-compression bonding apparatus according to a preferred embodiment of this invention.
Figure 2B:
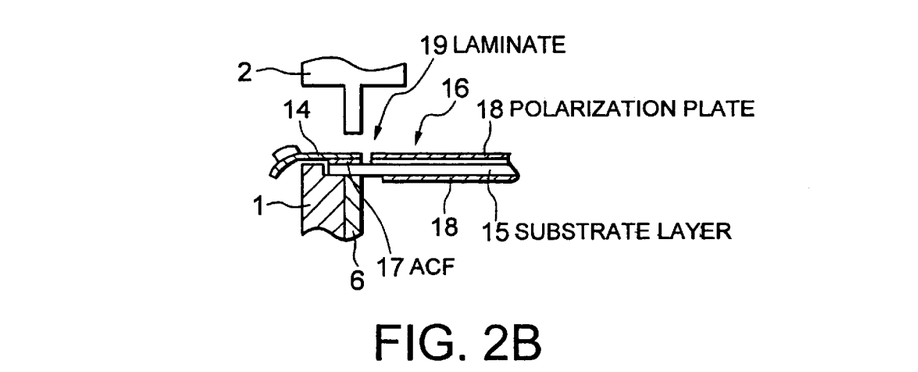
FIG. 2B shows a sectional view of a part of the thermo-compression bonding apparatus illustrated in FIG. 2A.
Figure 2C:
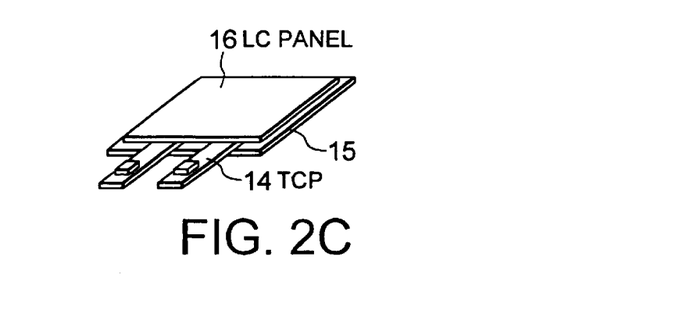
FIG. 2C shows a perspective view of a LC panel.

Referring to FIGS. 2A to 2C, description will proceed to a thermo-compression bonding apparatus according to a preferred embodiment of this invention. The thermo-compression bonding apparatus has a back-up 6 fixed to fixed bottom plate 8b for holding thereon laminate 19 of substrate layer 15, ACF 17, and TCP 14; compression bonding head 2 for applying pressure to laminate 19 placed on back-up 6; vertically movable plate 3 for mounting and fixing and moving compression bonding head 2 up and down guided by guide post 7; pneumatic cylinder 4 mounted to fixed top plate 8a for raising and lowering vertically movable plate 3 and imparting compression force to compression bonding head 2; and heating unit 1 disposed adjacent to back-up 6 on the side opposite the side where LC panel 16 is placed, and complementarily heating laminate 19.

Furthermore, because compression bonding head 2 descends in conjunction with vertically movable plate 3 guided by guide post 7, it does not bend due to the force of pressure from pneumatic cylinder 4 when the bottom of compression bonding head 2 contacts the top of back-up 6. That is to say, the pneumatic cylinder does not push directly on the compression bonding head as described in the related technology, but pushes by way of intervening vertically movable plate 3, and the compression force of the pneumatic cylinder 4 is dispersed to the entire compression bonding head 2.

Because a heater is provided internally to the compression bonding head 2, when the heater raises the temperature, the compression bonding head 2 expands longitudinally due to thermal expansion. However, horizontal expansion of the compression bonding head 2, which is secured to the vertically movable plate 3 with mounting bolts, is restricted by the mounting bolts. As a result, the compression bonding head 2 deflects in an arc. This produces a new problem, that is, that the bottom surface of the deflected compression bonding head 2 is not parallel to the top surface of the back-up 6.

To eliminate this compression bonding head 2 deflection is to eliminate the restriction of lateral movement when the temperature rises and compression bonding head 2 expands. For example, it is enough to loosen mounting bolts and produce movement between the compression bonding head 2 and the vertically movable plate 3 within the mounting bolt hole. However, if the mounting bolts are loosely tightened, repeated compression bonding operations will result in instability in the compression bonding head 2 even if it does not drop off, and it will not be possible to achieve normal compression.

For this reason a thermo-compression bonding apparatus according to the present invention provides an adjustment screw 5 for correcting compression bonding head 2 deflection. Using this adjustment screw 5, a part of the bottom surface of the compression bonding head 2 protruding due to deflection can be pulled in, or conversely a concavity can be pushed out, to make the bottom surface of the compression bonding head 2 and top surface of the back-up 6 parallel. This adjustment is described further below.

In addition, when the ACF setting temperature is 180 degrees C., for example, if the rated temperature of the compression bonding head 2 is set in the range from 170 degrees to 190 degrees, for example, deflection of the compression bonding head 2 will be constant, and it will not be necessary to readjust parallelism even if TCP size changes. Moreover, when there is the possibility that the heat capacity of the laminate 19 will increase and the time required to reach the setting temperature will become longer, this problem can be resolved with auxiliary heating by the heating unit 1 described further below.

It should be noted that the compression bonding head is preferably invar, an alloy with a low thermal expansion coefficient, but stainless steel, which is inexpensive and resistant to contamination and corrosion, can be used. In addition, if the temperature of compression bonding head 2 is controlled so as to not rise above 190 degrees, polarization plate 18 will not be burned by heat radiation therefrom.

Figure 3:
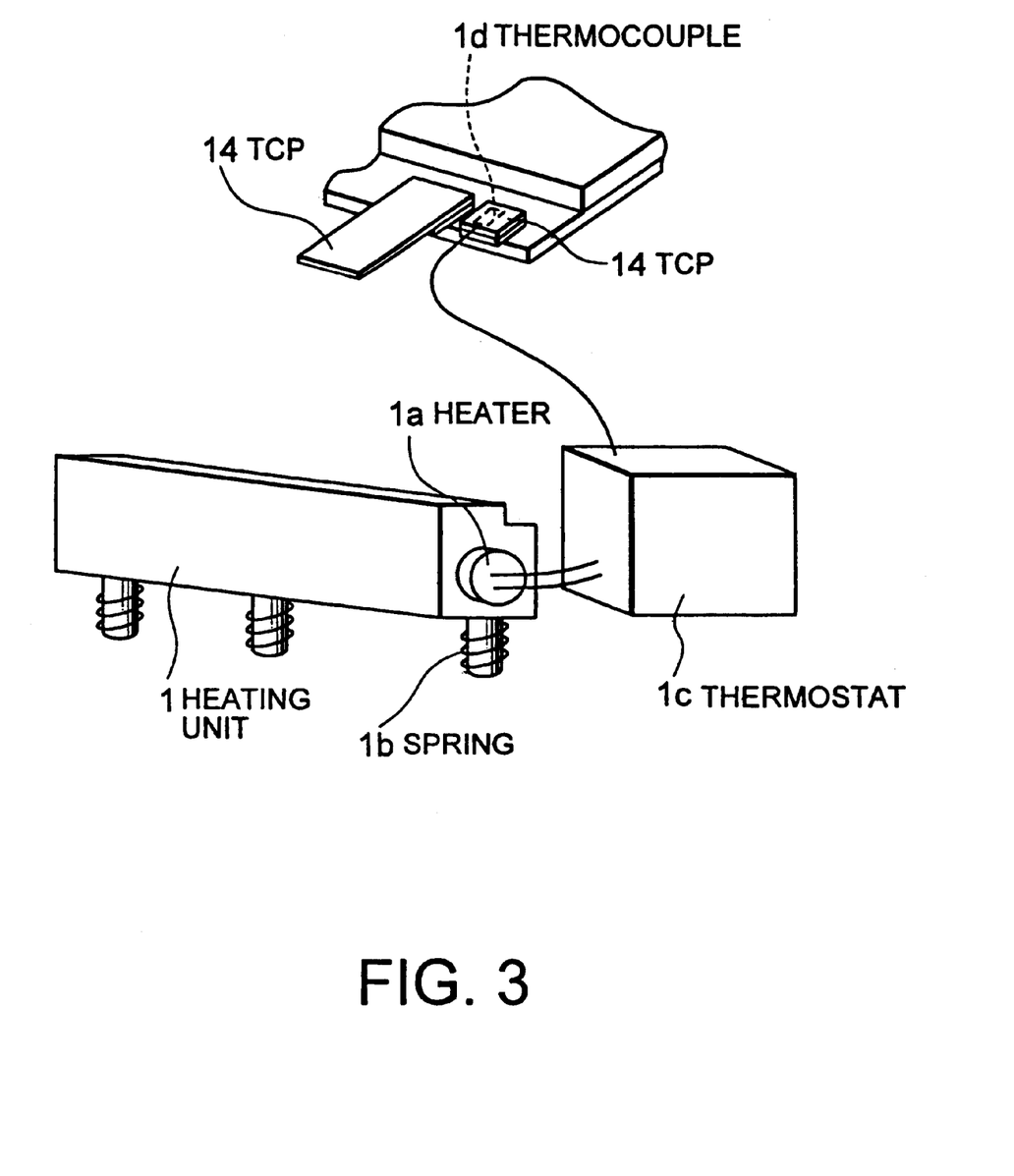
FIG. 3 shows a perspective view of an example of a heating unit positioned in the thermo-compression bonding apparatus illustrated in FIG. 2A.

Referring to FIG. 3, the heating unit 1 has a heater 1a imbedded in a stainless steel block. In addition, pressure from spring 1b exerts a constant contact force on the block against the substrate layer. Unlike the above noted temperature sensor imbedded in the compression bonding head 2, a thermocouple 1d of which the temperature measuring contact is coated with the same TCP 14 and ACF materials as the laminate 19 is preferably used. The temperature of this thermocouple 1d, which is a temperature sensor, is then input to thermostat 1c to control current supply to the heater 1a, heat the laminate on back-up 6 to a desired temperature, and maintain that temperature.

If the thermocouple 1d is thus laminated with the same material as the laminate, heat transfer will also be the same, and the temperature of the laminate 19 heated by heating unit 1 in FIG. 2A can be precisely controlled. Furthermore, if plural thermocouples 1d are placed at appropriate positions to the back-up 6 for temperature control, even more precise temperature management will be possible.

It should be noted that in FIG. 3 the laminate 19 and thermocouple 1d are separately provided, but thermocouple 1d can be included within laminate 19. In this case, however, care must be taken so that the temperature measuring contact of the thermocouple 1d does not contact the electrode terminals. Furthermore, if the thermocouple uses a low cost copper—constant material, the thermocouple can be cut off and thrown away after electrode terminal connection.

The preparation preceding the start of the electrode terminal bonding operation is described next. This preparation is the above noted compression bonding head 2 deflection correction. Adjusting the bottom surface of the compression bonding head 2 to be parallel to the top surface of the back-up 6 makes the pressure applied to each laminate 19 arranged longitudinally to on the back-up 6 uniform.

To accomplish this, the top surface of the back-up 6 is covered with a commercially available pressure sensitive paper. The pneumatic cylinder 4 is then operated to lower the compression bonding head 2, which is maintained at the rated temperature with deflection, thereby sandwiching the pressure sensitive paper between the back-up 6 and compression bonding head 2. The compression bonding head 2 is then raised and discoloration of the pressure sensitive paper observed. If the pressure sensitive paper has slight discoloration, the adjustment screw 5 at the corresponding position is screwed in to push downward that part of the compression bonding head 2. The back-up 6 is then covered with new pressure sensitive paper, compression bonding head 2 lowered and the pressure sensitive paper compressed, and discoloration of the pressure sensitive paper checked. These operations are repeated until discoloration of the pressure sensitive paper is uniform, at which time parallelism adjustment is completed.

When parallelism adjustment is completed the electrode terminal bonding operation is performed. This involves forming laminate 19 by temporarily bonding ACF 17 on substrate layer 15, adjusting the positions of the electrode terminals on substrate layer 15 under the ACF and the electrode terminals of the TCP 14, and temporarily bonding TCP 14 to ACF 17. This laminate 19 and thermocouple 1d in FIG. 3 are then placed on back-up 6.

Next, compression bonding head 2 maintained at 180 degrees C. is lowered while at the same time complementarily heating laminate 19 by means of heating unit 1. When compression bonding head 2 contacts TCP 14, the ACF is heated to between 180 degrees and 190 degrees and melted by heat transfer from compression bonding head 2 and heat transfer from heating unit 1, and set as a result of crosslinking over time. In addition, conductive particles in the ACF between the electrode terminals agglomerate with the applied pressure and complete connection of the TCP and substrate electrode terminals.

Furthermore, even if the TCP dimensions and count change, there is no need to repeat the parallelism adjustment if the temperature of compression bonding head 2 is held constant, and if the time required for the compression bonding head 2 to raise the temperature of laminate 19 increases, heating unit 1 output can be increased to shorten the time needed to reach the rated temperature. By disposing a temperature sensor having the same structure and materials as laminate 19 at the bonding position, the temperature of the laminate can be accurately detected and the heating temperature of the laminate 19 precisely controlled. By providing a means for adjusting the parallelism between the bottom surface of the compression bonding head 2 and top surface of the back-up 6, bonding is possible with no shifting of the electrode terminals even if the TCP count and type change.

Figure 4:
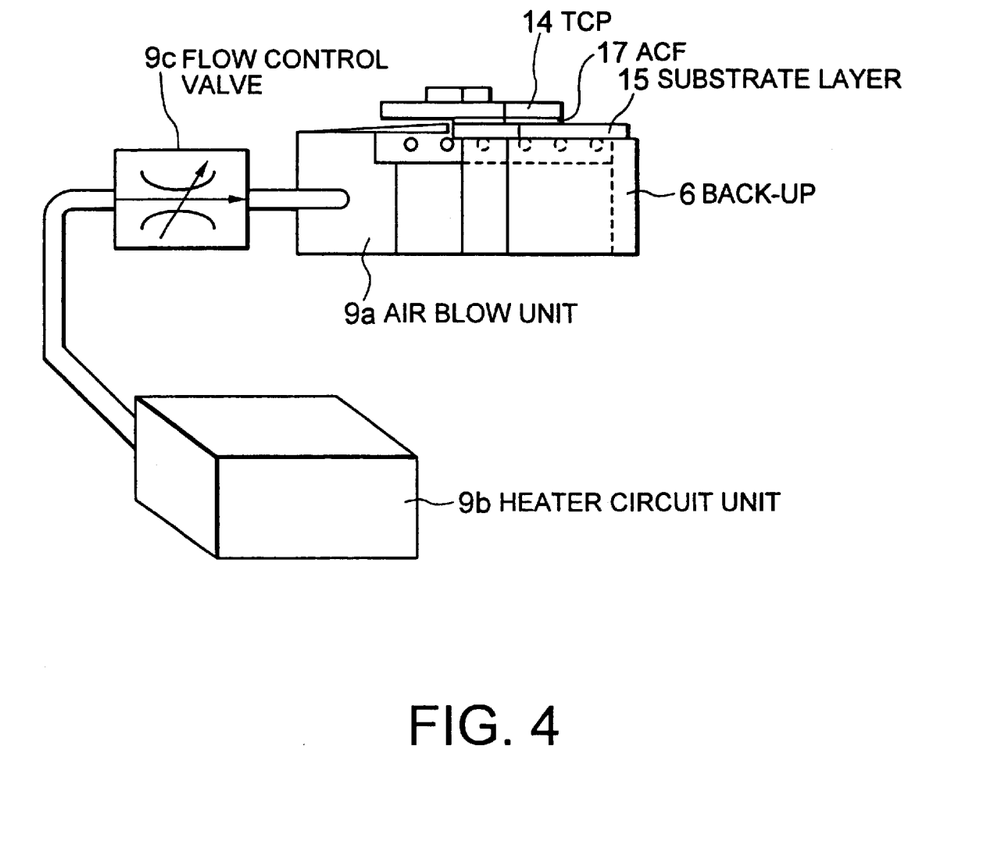
FIG. 4 shows a perspective view of another example of a heating unit positioned in the thermo-compression bonding apparatus illustrated in FIG. 2A.

Referring to FIG. 4, description will be made about another example of the heating unit. The heating unit in this thermo-compression bonding apparatus, as shown in FIG. 4, has an air blower unit 9a for blowing warmed air over the laminate of substrate layer 15, ACF 17, and TCP 14 placed on back-up 6; a heater circuit unit 9b for drawing outside air, heating the drawn air, applying a temperature signal to thermocouple 1d in FIG. 2, and supplying hot air heated to a rated temperature to the air blower unit 9a; and flow control valve 9c for adjusting the flow of the supplied hot air.

Furthermore, the air blower unit 9a is substantially the same length as back-up 6 with plural holes from which the hot air flows formed in the longitudinal direction. Because it is not necessary to force hot air from where the laminate is not present, the air holes can be closed off using a shutoff valve. This heating unit has the advantage of consuming less power than the heating unit described above.

Figure 5:
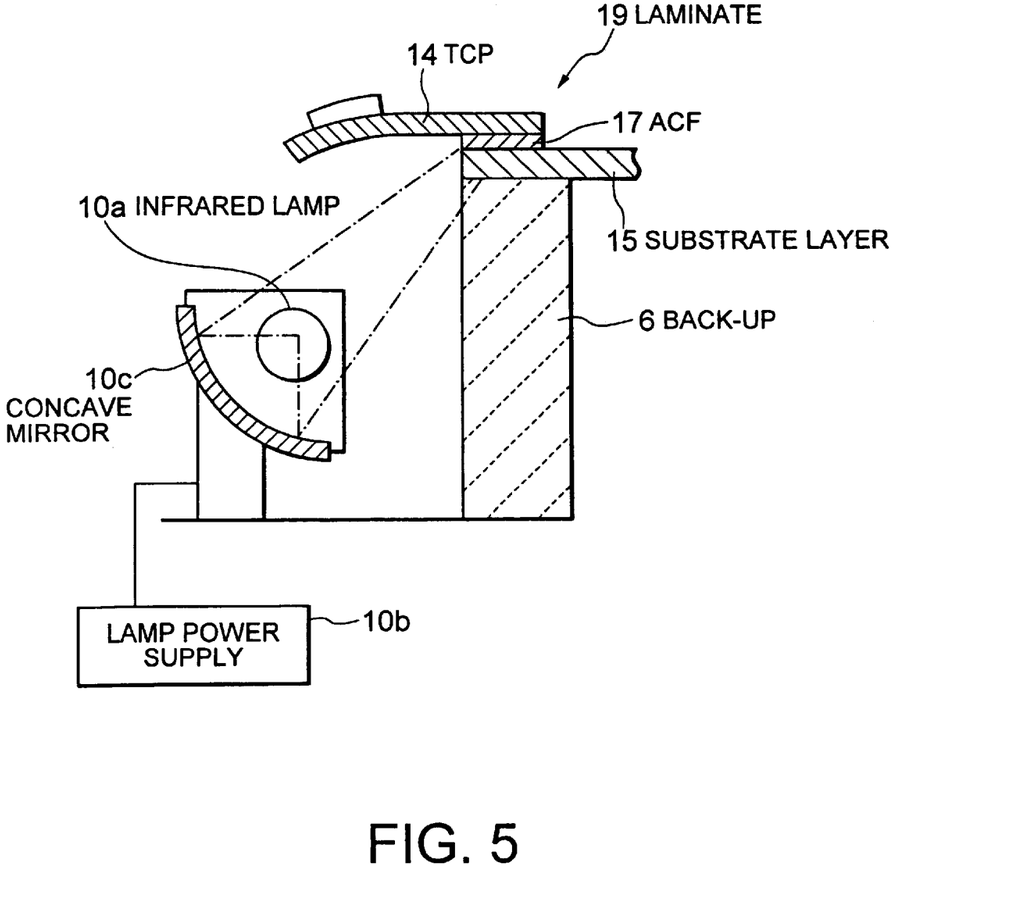
FIG. 5 shows a perspective view of still another example of a heating unit positioned in the thermo-compression bonding apparatus illustrated in FIG. 2A.

Referring to FIG. 5, description will be made as regards still another example of the heating unit. The heating unit has an infrared lamp 10a for emitting infrared radiation, a concave mirror 10c for gathering the emitted infrared radiation, and a lamp power supply 10b for supplying power to the infrared lamp 10a.

In addition, an advantage of this heating unit is that the heating rate of the laminate 19 is faster compared with the above described heating units because the gathered infrared light passing back-up 6, which is glass, is emitted directly to laminate 19. In this case the temperature signal from the thermocouple 1d in FIG. 3 is applied to lamp power supply 10b to control the power supplied to the infrared lamp 10a so that the temperature of the laminate 19 of substrate layer 15, ACF 17, and TCP 14 can be maintained from 170 degrees C. to 190 degrees.

As described above, the compressive force of the pneumatic cylinder is dispersed across the entire length of the thermo-compression bonding head, and the compressed plural TCP are thermo-compression bonded by uniform pressure in the present invention because the pneumatic cylinder applying pressure to the compression bonding head is not linked directly to the compression bonding head but rather is connected to the compression bonding head by way of an intervening vertically movable plate that travels up and down guided by rigid guide posts. Furthermore, because deflection of the compression bonding head due to thermal expansion can be corrected by a deflection correcting means, the occurrence of bonding defects and electrode terminal shifting resulting from insufficient compression force as a result of parallelism problems between the compression surface of the compression bonding head and the mounting surface of the back-up can be reduced.

Furthermore, because the temperature of the thermo-compression bonding head is held within a rated range, deflection of the compression bonding head due to thermal expansion can be kept constant, and by providing a means for correcting deflection of the thermo-compression bonding head due to deflection, plural TCP can be thermo-compression bonded with uniform pressure even if the temperature rises.

Moreover, because by providing an auxiliary heating unit the laminate of TCP, ACF, and substrate layer can be quickly raised to a rated temperature even if the TCP size changes and heat capacity increases, the ACF can be set in a short time, and electrode terminal bonding defects can be reduced.

Yet further, burning the polarization plate of the LC panel can be eliminated by providing the heating unit separated from the LC panel at a position where the back-up acts as a heat shield, and controlling the temperature of the heating unit to less than or equal to the rated temperature.

While this invention has thus far been described in conjunction with the preferred embodiment thereof, it will readily be possible for those skilled in the art to put this invention into practice on various other manner.

What is claimed is:

1. A method of connecting liquid crystal panel electrode terminals to external drive circuit electrode terminals by thermo-compression, comprising the steps of:

compressing laminate members by a compression bonding head having heating means and whose temperature is kept at a predetermined temperature, to heat said laminate members to said predetermined temperature, said laminate members being formed by overlapping and temporarily fixing electrode terminals of a substrate extending from an edge of a liquid crystal panel and electrode terminals of an external drive circuit with an anisotropic conductive film therebetween;

providing an auxiliary heating unit;

detecting the temperature of said laminate members near an area of compression bonding; and auxiliary heating said laminate members which have been heated by said compression bonding head by said auxiliary heating unit to make the temperature of said laminate members to be maintained at a desired temperature to thereby connect said liquid crystal panel electrode terminals to said external drive circuit electrode terminals.

2. A method of connecting liquid crystal panel electrode terminals to external drive circuit electrode terminals by thermo-compression, comprising the steps of:

compressing laminate members by a compression bonding head whose temperature is kept at a predetermined temperature, to heat said laminate members to said predetermined temperature, said laminate members being formed by overlapping and temporarily fixing electrode terminals of a substrate extending from an edge of a liquid crystal panel and electrode terminals of an external drive circuit with an anistropic conductive film therebetween;

making the temperature of said laminate members be kept at a desired temperature by an auxiliary heating unit for auxiliary heating said laminate members heated by said compression bonding head to thereby connect said liquid crystal panel electrode terminals to said external drive circuit electrode terminals;

detecting the temperature of said laminate members as a detection temperature by a thermocouple which is placed on said substrate and which is coated with said anistropic conductive film and a film of the external drive circuit; and controlling heat energy of said auxiliary heating unit in accordance with said detection temperature.

3. A method of connecting liquid crystal panel electrode terminals to external drive circuit electrode terminals by thermo-compression, comprising the steps of:

compressing laminate members by a compression bonding head having heating means and whose temperature is kept at a predetermined temperature, to heat said laminate members to said predetermined temperature, said laminate members being formed by overlapping and temporarily fixing electrode terminals of a substrate extending from an edge of a liquid crystal panel and electrode terminals of an external drive circuit with an anistropic conductive film therebetween;

providing auxiliary heating means; and auxiliarily heating said laminate members which have been heated by said compression bonding head by said auxiliary heating means to make the temperature of said laminate members be kept at a different temperature from said predetermined temperature so that said liquid crystal panel electrode terminals are connected to said external drive circuit electrode terminals.

4. A method as claimed in claim 3, wherein:

said auxiliary heating means in said step of auxiliary heating said laminate members which have been heated by said compression bonding head is an auxiliary heating unit.

5. A method as claimed in claim 3, further comprising the steps of:

detecting the temperature of said laminate members as a detection temperature by a thermocouple which is placed on said substrate and which is coated with said anistropic conductive film and a film of the external drive circuit; and controlling heat energy of said auxiliary heating means in accordance with said detection temperature.

* * * * *